(12) United States Patent
Miao

(10) Patent No.: US 11,825,676 B2
(45) Date of Patent: Nov. 21, 2023

(54) QUANTUM DOT LIGHT EMITTING DEVICE AND APPLICATION

(71) Applicant: BOE Technology Group Co., Ltd., Beijing (CN)

(72) Inventor: Xiang Miao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 148 days.

(21) Appl. No.: 17/402,080

(22) Filed: Aug. 13, 2021

(65) Prior Publication Data

US 2022/0093889 A1 Mar. 24, 2022

(30) Foreign Application Priority Data

Sep. 23, 2020 (CN) .......................... 202011010637.0

(51) Int. Cl.
*H10K 50/15* (2023.01)
*C09K 11/88* (2006.01)
*H10K 71/00* (2023.01)
*H10K 85/30* (2023.01)
*H10K 50/115* (2023.01)
*H10K 102/00* (2023.01)

(52) U.S. Cl.
CPC ............ *H10K 50/15* (2023.02); *C09K 11/881* (2013.01); *H10K 71/00* (2023.02); *H10K 85/371* (2023.02); *H10K 50/115* (2023.02); *H10K 2102/331* (2023.02)

(58) Field of Classification Search
None
See application file for complete search history.

(56) References Cited

U.S. PATENT DOCUMENTS

| 2013/0009131 A1* | 1/2013 | Kazlas | H10K 50/11 257/13 |
| 2019/0276734 A1* | 9/2019 | Kim | C09K 11/883 |

FOREIGN PATENT DOCUMENTS

| CN | 109216568 A | * | 1/2019 | |
| CN | 106062983 B | * | 3/2019 | ....... H01L 31/02167 |
| CN | 109417079 A | * | 3/2019 | ............. B82Y 40/00 |
| CN | 113471361 A | * | 10/2021 | |
| EP | 3038168 A1 | * | 6/2016 | ......... H01L 29/1606 |

* cited by examiner

*Primary Examiner* — Michael Lebentritt
(74) *Attorney, Agent, or Firm* — IPro, PLLC

(57) ABSTRACT

The present disclosure discloses a quantum dot light emitting device and application thereof. The quantum dot light emitting device includes: an anode and a cathode disposed oppositely, a quantum dot light emitting layer arranged between the anode and the cathode, and a hole transport layer arranged between the anode and the quantum dot light emitting layer, wherein a material of the hole transport layer is a copper-based quantum dot with a short-chain ligand on a surface.

20 Claims, 4 Drawing Sheets

| Cathode | — 2 |
| Quantum dot light emitting layer | — 3 |
| Hole transport layer (short-chain ligand copper-based quantum dot) | — 4 |
| Anode | — 1 | ized
QUANTUM DOT LIGHT EMITTING DEVICE AND APPLICATION

CROSS-REFERENCE TO RELATED APPLICATION

This application is based on and claims priority under 35 U.S.C 119 to Chinese Patent Application No. 202011010637.0, filed on Sep. 23, 2020, in the China National Intellectual Property Administration. The entire disclosure of the above application is incorporated herein by reference.

FIELD

The present disclosure relates to the technical field of display, in particular to a quantum dot light emitting device and application thereof.

BACKGROUND

A Quantum Dot (QD for short), serving as a novel light emitting material, has the advantages of high light color purity, high light emitting quantum efficiency, light emitting color adjustability, a long service life and the like, and has become a research focus of a light emitting material in a current novel light emitting diode. Therefore, Quantum Dot Light Emitting Diodes (QLED for short) with the quantum dot material as a light emitting layer becomes a main direction of current novel display device research.

SUMMARY

A quantum dot light emitting device provided by an embodiment of the present disclosure includes: an anode and a cathode disposed oppositely, a quantum dot light emitting layer located between the anode and the cathode, and a hole transport layer located between the anode and the quantum dot light emitting layer, wherein a material of the hole transport layer is a copper-based quantum dot with a short-chain ligand on a surface.

Optionally, in the above quantum dot light emitting device provided by an embodiment of the present disclosure, a chemical formula of the copper-based quantum dot is CuXY, wherein X=Ga or In, and Y=S, Se or Te.

Optionally, in the above quantum dot light emitting device provided by an embodiment of the present disclosure, a chain length of the short-chain ligand is less than ten carbon atoms.

Optionally, in the above quantum dot light emitting device provided by an embodiment of the present disclosure, the short-chain ligand is a ligand including mercapto, amino or carboxyl.

Optionally, in the above quantum dot light emitting device provided by an embodiment of the present disclosure, the short-chain ligand includes 3-mercaptopropionic acid, caprylic acid, octylamine or hexanethiol.

Accordingly, an embodiment of the present disclosure further provides a display apparatus, including the above quantum dot light emitting device provided by an embodiment of the present disclosure.

Accordingly, an embodiment of the present disclosure further provides a method for manufacturing a hole transport material, including:

preparing a copper-based quantum dot with a long-chain ligand on a surface through a solution process;

adding a short-chain ligand material into a solution of the copper-based quantum dot so as to enable a short-chain ligand to substitute the long-chain ligand; and cleaning a substituted solution to obtain a copper-based quantum dot with the short-chain ligand on a surface to serve as the hole transport material.

Optionally, in the above method provided by an embodiment of the present disclosure, a chemical formula of the copper-based quantum dot is CuXY, wherein X=Ga or In, and Y=S, Se or Te.

Optionally, in the above method provided by an embodiment of the present disclosure, adding the short-chain ligand material into the solution of the copper-based quantum dot solution so as to enable the short-chain ligand to substitute the long-chain ligand, specifically includes:

adding the short-chain ligand material into the solution of the copper-based quantum dot solution to form a mixed solution;

adding a sodium hydroxide solution into the mixed solution to adjust a PH value of the mixed solution; and stirring the mixed solution for a first preset duration so as to enable the short-chain ligand to substitute the long-chain ligand.

Optionally, in the above method provided by an embodiment of the present disclosure, the PH value of the mixed solution is 8-9.

Optionally, in the above method provided by an embodiment of the present disclosure, after stirring the mixed solution for the first preset duration so as to enable the short-chain ligand to substitute the long-chain ligand, the manufacturing method further includes:

standing the mixed solution for a second preset duration.

Optionally, in the above method provided by an embodiment of the present disclosure, the first preset duration is 1-3 hours, and the second preset duration is greater than 2 hours.

Optionally, in the above method provided by an embodiment of the present disclosure, cleaning the substituted solution to obtain the copper-based quantum dot with the short-chain ligand on the surface, includes:

transferring the substituted solution into a preset solvent; and taking the copper-based quantum dot with the short-chain ligand on the surface out of the preset solvent for purifying and cleaning.

Optionally, in the above method provided by an embodiment of the present disclosure, a chain length of the short-chain ligand is less than ten carbon atoms.

Optionally, in the above method provided by an embodiment of the present disclosure, the short-chain ligand is a ligand including mercapto, amino or carboxyl.

Optionally, in the above method provided by an embodiment of the present disclosure, the short-chain ligand includes 3-mercaptopropionic acid, caprylic acid, octylamine or hexanethiol.

Accordingly, an embodiment of the present disclosure further provides a method for manufacturing a quantum dot light emitting device, including:

forming an anode, a hole transport layer, a quantum dot light emitting layer and a cathode disposed in a stacked mode, wherein a material of the hole transport layer is a copper-based quantum dot with a short-chain ligand on a surface.

Optionally, in the above method provided by an embodiment of the present disclosure, a chain length of the short-chain ligand is less than ten carbon atoms.

Optionally, in the above method provided by an embodiment of the present disclosure, the short-chain ligand is a ligand including mercapto, amino or carboxyl.

Optionally, in the above method provided by an embodiment of the present disclosure, the short-chain ligand includes 3-mercaptopropionic acid, caprylic acid, octylamine or hexanethiol.

DETAILED DESCRIPTION OF THE EMBODIMENTS

Figure 1:
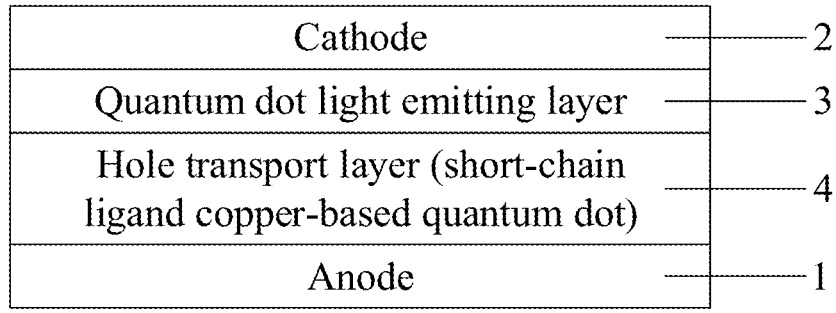
FIG. 1 is a schematic structural diagram of a quantum dot light emitting device provided by an embodiment of the present disclosure.

In order to make the objective, technical solutions and advantages of the embodiments of the present disclosure more clear, the technical solutions of the embodiments of the present disclosure will be described clearly and completely with reference to the drawings of the embodiments of the present disclosure. Obviously, the described embodiments are part of the embodiments of the present disclosure, but not all the embodiments. The embodiments in the present disclosure and features in the embodiments can be mutually combined in the case of no conflict. On the basis of the described embodiments of the present disclosure, all other embodiments obtained by a person of ordinary skill in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The word "including" or "comprising" and the like used in the present disclosure, means that an element or item preceding the word comprises an element or item listed after the word and the equivalent thereof, without excluding other elements or items. The word "connection" or "coupling" and the like is not restricted to physical or mechanical connection, but may include electrical connection, whether direct or indirect. The words "inner", "outer", "up", "down" and the like are only used to indicate the relative positional relationship. When the absolute position of the described object changes, the relative positional relationship may also change accordingly.

It should be noted that the size and shapes of all graphs in the drawings do not reflect the true scale, and only intend to illustrate the content of the present disclosure. The same or similar reference numbers represent the same or similar elements or elements with the same or similar functions from beginning to end.

At present, many efficient QLEDs are based on an organic material (for example, PEDOT: PSS) serving as a hole transport layer. Although the organic material is excellent in performance, it is well-known that its instability makes a device exposed in air to be very sensitive to oxygen and humidity. In addition, its hole transport rate is lower than that of an inorganic material by about 2-3 orders of magnitude, which is not beneficial to photoelectric performance of the device either. Therefore, it needs to find the suitable inorganic material to substitute an organic hole transport material.

Copper-based semiconductor nanoparticles (namely, a copper-based quantum dot) CuXY, with X=Ga or In, and Y=S, Se or Te, have a suitable band gap, and also have the characteristics of environment-friendly composition elements, low cost and the like. For example, a copper indium selenium (CISe) quantum dot is a common chalcopyrite semiconductor material, has the advantages of bandgap adjustability, hypotoxicity, simple preparation, low cost and the like, and meanwhile can serve as the hole transport material to be used in a quantum dot light emitting diode device.

A synthesized copper-based quantum dot is mostly subjected to solution synthesis through a hot injection method. A temperature, a retention time and the like in a reaction process will affect a morphology and a size of the quantum dot. Except for these basic reaction conditions, organic surface active molecules, namely a surface ligand, in the reaction process are also an important condition for affecting the quantum dot synthesis. In the reaction process, after the quantum dot is reacted and nucleated, a surface of a nucleus is wrapped with an organic solvent to form an organic long-chain ligand, and these ligands can control growth of the nucleus to regulate and control the size and the morphology of the quantum dot. Interaction force between organic long chains enables the quantum dot to be well dispersed in most nonpolar organic solvents, moreover, these organic long chains eliminate van der waals force between the particles, and effectively prevent the particles from agglomerating so that the quantum dot can be stably dispersed in the nonpolar solvent. In order to stabilize a quantum dot structure and improve a quantum dot synthesizing efficiency, the long-chain organic solvents such as oleylamine, oleic acid, trimethylamine, trioctylphousphine oxide, octadecene, and dodecanethiol will be used thereinto. Through heavy use of the long-chain organic solvents, the surfaces of the quantum dots are wrapped with the insulated organic long chains. However, when the quantum dots serve as a functional layer material to be applied, the organic long chains severely affect charge transport between the quantum dots, also make the charge transport property of a formed quantum dot film poor, and severely affect the device performance if the long-chain quantum dots are applied into the QLED device.

Therefore, in order to improve carrier transport performance so as to improve the QLED device performance, an embodiment of the present disclosure provides a quantum dot light emitting device, as shown in FIG. 1, including: an anode 1 and a cathode 2 disposed oppositely, a quantum dot light emitting layer 3 located between the anode 1 and the cathode 2, and a hole transport layer 4 located between the anode 1 and the quantum dot light emitting layer 3, wherein a material of the hole transport layer 4 is a copper-based quantum dot with a short-chain ligand on a surface prepared by adopting above manufacturing method of a hole transport material provided by an embodiment of the present disclosure.

According to the above quantum dot light emitting device provided by an embodiment of the present disclosure, the copper-based quantum dot with the short-chain ligand on the surface is adopted to be used for a hole transport material, and the short-chain ligand can improve electrical conductivity of a quantum dot, improve a carrier transport efficiency and improve a performance of the quantum dot light emitting device. In addition, the copper-based quantum dot, serving as an inorganic hole transport material, has a high hole mobility and good stability, and may be subjected to solvation treatment. Moreover, the copper-based quantum dot is selected as the hole transport material, and an energy level can be conveniently adjusted by adjusting a particle size so as to be better matched with the light emitting layer.

During specific implementation, in the above quantum dot light emitting device provided by an embodiment of the present disclosure, a chain length of the short-chain ligand is generally less than ten carbon atoms, and a chain length of a long-chain ligand is generally greater than ten carbon atoms.

During specific implementation, in the above quantum dot light emitting device provided by an embodiment of the present disclosure, a ligand containing groups such as mercapto9, amino and carboxyl is coordinated with the quantum dot more easily, therefore, the short-chain ligand provided by an embodiment of the present disclosure may be a ligand including mercapto, amino or carboxyl.

During specific implementation, in the above quantum dot light emitting device provided by an embodiment of the present disclosure, the short-chain ligand may include 3-mercaptopropionic acid, caprylic acid, octylamine or hexanethiol and other ligands. These short-chain ligands may be exchanged with a copper-based quantum dot with a long-chain ligand on a surface to form the copper-based quantum dot of the short-chain ligand, to serve as the hole transport layer material, thereby improving the electrical conductivity of the quantum dot, improving the carrier transport efficiency and improving the performance of the quantum dot light emitting device.

During specific implementation, in the above quantum dot light emitting device provided by the embodiment of the present disclosure, when the short-chain ligand adopts 3-mercaptopropionic acid (MPA), a group coordinated with the quantum dot is mercapto; when the short-chain ligand adopts caprylic acid, a group coordinated with the quantum dot is carboxyl; when the short-chain ligand adopts octylamine, a group coordinated with the quantum dot is amino; and when the short-chain ligand adopts hexanethiol, a group coordinated with the quantum dot is mercapto.

It should be noted that the embodiment of the present disclosure only provides part of the short-chain ligand. Certainly, during specific implementation, the short-chain ligand is not limited to these ligands provided by embodiments of the present disclosure. The short-chain ligands having a strong complexing capability all fall within the protection scope of the present disclosure.

During specific implementation, the above quantum dot light emitting device provided by an embodiment of the present disclosure may be of an upright structure or an inverted structure.

During specific implementation, the above quantum dot light emitting device provided by an embodiment of the present disclosure may further include other functional film layers well-known by the skilled in the art, which will not be described in detail here.

Figure 2:
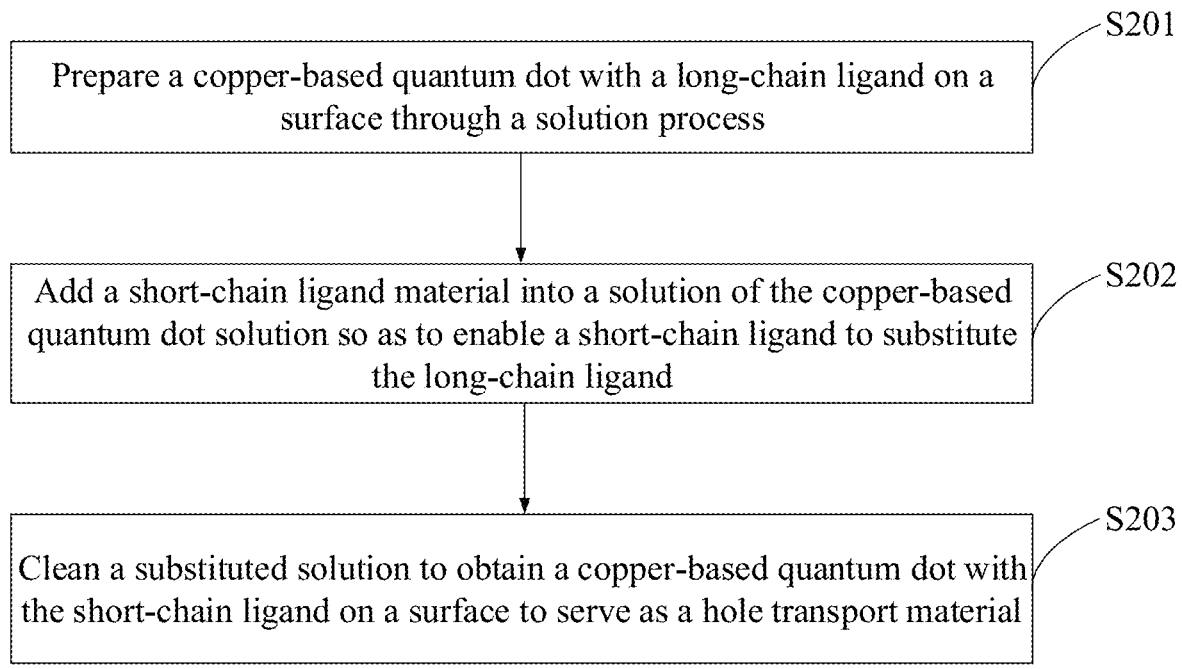
FIG. 2 is a flow diagram of a manufacturing method of a hole transport material provided by an embodiment of the present disclosure.

Based on the same inventive concept, an embodiment of the present disclosure further provides a manufacturing method of a hole transport material, as shown in FIG. 2. including:

S201, a copper-based quantum dot with a long-chain ligand on a surface is prepared through a solution process.

Optionally, a chemical formula of the copper-based quantum dot is CuXY, wherein X=Ga or In, and Y=S, Se or Te. Taking a CuInSe quantum dot as an example, a method for preparing a CISe quantum dot through a hot injection method is as following:

(1) a selenium precursor is prepared: 0.5 ml of oleylamine (OAm) and 3 ml of diphenylphosphine (DPP) are added into 0.3 mmol of selenium powder (Se), ultrasonic stirring is performed until a clear and light-yellow DPP-Se precursor solution is formed for standby application, wherein the selenium powder is a selenium source, oleylamine is a ligand, and diphenylphosphine can dissolve the selenium powder;

(2) 0.1 mmol of copper iodide (CuI), 0.1 mmol of indium acetate (In(OAc)$_3$), 2.0 ml of oleylamine (OAm) and 2.0 ml of octadecene (ODE) are added into a clean three-necked flask with a capacity of 50 ml, nitrogen is introduced into the three-necked flask so as to be avoid oxidation in a reaction process, so that an overall experiment process is performed in a nitrogen environment, wherein oleylamine and octadecene, serving as a solvent and the ligand, may also be substituted with liquid paraffin, dodacyl mercaptan and the like, a copper source may also be substituted with cuprous chloride, and an indium source may also be substituted with indium chloride;

(3) a mixed solution in step (2) is stirred at room temperature for 5 min to remove air in the three-necked flask and the solution;

(4) a mixed solution in step (3) is heated to 100° C.-150° C. and kept at the temperature for 5 min, it is ensured that a reaction environment has no water and oxygen, it may be observed that the mixed solution becomes the clear and light yellow, and then the mixed solution is continued to be heated to 160° C.-200° C.;

(5) the DPP-Se precursor solution prepared in step (1) is quickly added into the mixed solution at 160° C.-200° C. in step (4), the mixed solution quickly becomes black, it shows that a CuInSe quantum dot crystal nucleus has begun to be generated, and a reaction system is kept at the temperature for 10 min, so that the CuInSe quantum dot grows completely;

(6) 10 min later, a temperature of a mixed solution finally obtained in step (5) is decreased to the room temperature, and thus the CuInSe quantum dot with a long-chain ligand on a surface is synthesized; and (7) acetone is added into a synthesized CuInSe quantum dot solution and then centrifugation and cleaning are performed, the process is repeated for three times, and the cleaned CuInSe quantum dot is prepared into a 100 mg/ml solution for standby application.

It should be noted that the above steps (1)-(7) only exemplarily illustrate the process of synthesizing the CuInSe quantum dot through the hot injection method. Some used parameters are parameters adopted when an inventor of the case synthesizes the CuInSe quantum dot. Of course, the above parameters are not limited to numerical values of the case, and may be selected according to actual needs and are not limited to the present disclosure. In addition, when other copper-based quantum dots are synthesized, parameters of different substrates are also different, and the skilled in the art can perform matching reasonably.

S202, a short-chain ligand material is added into a copper-based quantum dot solution with the long-chain ligand on the surface so as to enable a short-chain ligand to substitute the long-chain ligand.

Figure 3:
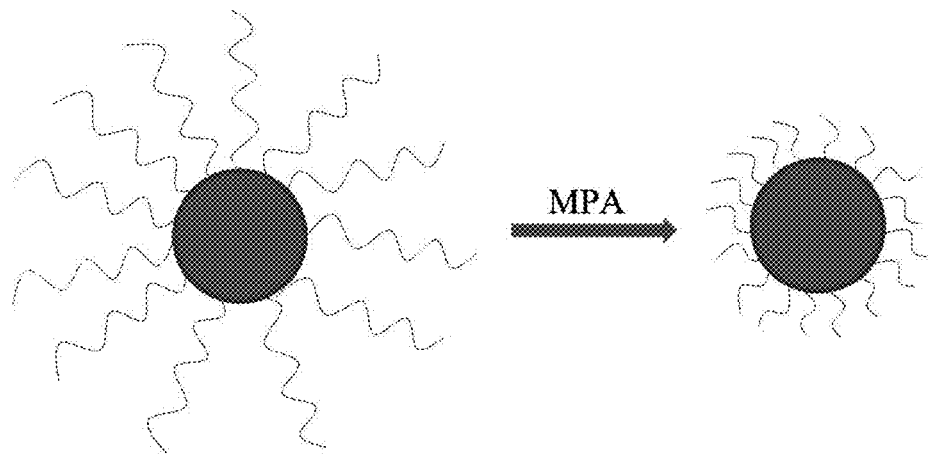
FIG. 3 is a schematic diagram of substitution of a long-chain ligand with a short-chain ligand provided by an embodiment of the present disclosure.

Optionally, taking the CuInSe quantum dot as an example, the cleaned and purified CuInSe quantum dot is taken and dispersed in nonpolar solvent chloroform, ultrasound is performed until dispersion is complete, and chloroform may also be substituted with other nonpolar solvents such as methylbenzene; the short-ligand ligand material is added into the completely-dispersed CuInSe quantum dot chloroform solution, so that the short-chain ligand gradually substitutes the long-chain ligand, as shown in FIG. 3, FIG. 3 is a simulation schematic diagram of exchanging the long-chain ligand into the short-chain ligand, wherein a sphere represents the CuInSe quantum dot.

S203, the substituted solution is cleaned to obtain a copper-based quantum dot with the short-chain ligand on a surface to serve as the hole transport material.

Optionally, a methanol solution may be used for purifying and cleaning.

According to the above manufacturing method of the hole transport material provided by an embodiment of the present disclosure, the long-chain ligand on the surface of the copper-based quantum dot is substituted into the short-chain ligand to serve as the hole transport material, thereby improving the electrical conductivity of the quantum dot, improving the carrier transport efficiency and improving the performance of the quantum dot light emitting device. In addition, the copper-based quantum dot, serving as the inorganic hole transport material, has the high hole mobility and good stability, and may be subjected to solvation treatment. Moreover, the copper-based quantum dot is selected as the hole transport material, and the energy level can be conveniently adjusted by adjusting the particle size so as to be better matched with the light emitting layer.

During specific implementation, in the above manufacturing method of the hole transport material provided by an embodiment of the present disclosure, a chain length of the short-chain ligand is generally less than ten carbon atoms, and a chain length of the long-chain ligand is generally greater than ten carbon atoms.

During specific implementation, in the above manufacturing method of the hole transport material provided by an embodiment of the present disclosure, a ligand containing groups such as mercapto, amino and carboxyl is coordinated with the quantum dot more easily, therefore, the short-chain ligand provided by the embodiment of the present disclosure may be a ligand including mercapto, amino or carboxyl.

During specific implementation, in the above manufacturing method of the hole transport material provided by an embodiment of the present disclosure, the short-chain ligand may include 3-mercaptopropionic acid, caprylic acid, octylamine or hexanethiol and other ligands. These short-chain ligands may be exchanged with the copper-based quantum dot with the long-chain ligand on the surface to form the copper-based quantum dot of the short-chain ligand, to serve as the hole transport layer material, thereby improving the electrical conductivity of the quantum dot, improving the carrier transport efficiency and improving the performance of the quantum dot light emitting device.

During specific implementation, in the above manufacturing method of the hole transport material provided by an embodiment of the present disclosure, when the short-chain ligand adopts 3-mercaptopropionic acid (MPA), a group coordinated with the quantum dot is mercapto; when the short-chain ligand adopts caprylic acid, a group coordinated with the quantum dot is carboxyl; when the short-chain ligand adopts octylamine, a group coordinated with the quantum dot is amino; and when the short-chain ligand adopts hexanethiol, a group coordinated with the quantum dot is mercapto.

It should be noted that the embodiment of the present disclosure only provides part of the short-chain ligand. Certainly, during specific implementation, the short-chain ligand is not limited to these ligands provided by some embodiments of the present disclosure. The short-chain ligands having the strong complexing capability all fall within the protection scope of the present disclosure.

Figure 4:
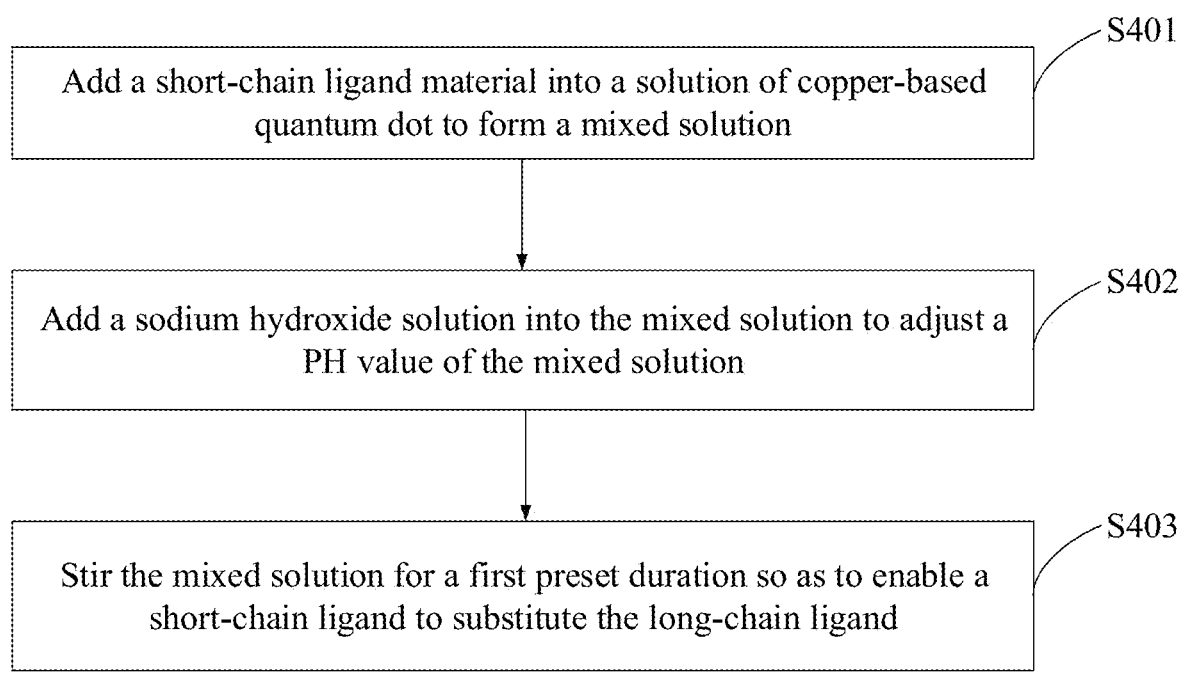
FIG. 4 is a flow diagram of another manufacturing method of a hole transport material provided by an embodiment of the present disclosure.

During specific implementation, in the above manufacturing method of the hole transport material provided by an embodiment of the present disclosure, adding the short-chain ligand material into the copper-based quantum dot solution with the long-chain ligand on the surface so as to enable the short-chain ligand to substitute the long-chain ligand, as shown in FIG. 4, may include.

S401, the short-chain ligand material is added into the copper-based quantum dot solution with the long-chain ligand on the surface to form a mixed solution.

Figure 5:
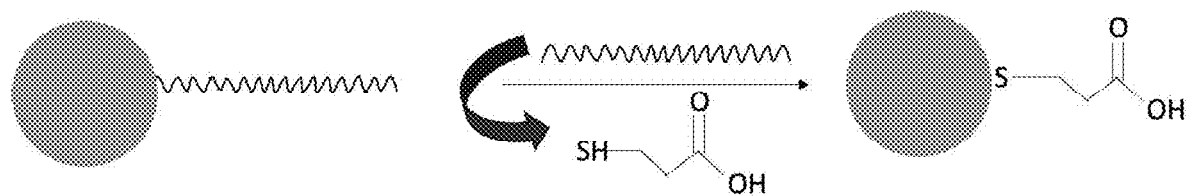
FIG. 5 is a schematic diagram of another substitution of a long-chain ligand with a short-chain ligand provided by an embodiment of the present disclosure.

Optionally, 3-mercaptopropionic acid (MPA) is added into the CuInSe quantum dot solution with the long-chain ligand on the surface, 3-mercaptopropionic acid (MPA) is a bifunctional connecting molecule and may serve as a surface competing ligand. MPA is used as the surface competing ligand, a mercapto short chain of MPA is substituted with the organic long-chain ligand on the surface of the CuInSe quantum dot, the CuInSe quantum dot is exchanged into the quantum dot wrapped by the organic short chain, thereby ensuring good dispersity of the quantum dot and improving the charge transport performance of the quantum dot. In addition, ligand exchange generally adopts a ligand with the high complexing capacity to substitute a ligand with a weak complexing capacity. Mercapto is the ligand with the high complexing capacity, therefore, MPA may substitute an original long-chain ligand, as shown in FIG. 5, FIG. 5 is a schematic diagram of an exchange process for substituting a long-chain ligand carbon chain ( ~~~~~~~~~ ) on the surface of the quantum dot with the MPA short-chain ligand

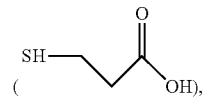

wherein sphere represents the CuInSe quantum dot.

Optionally, MPA is adopted as the competing ligand. Deionized water is further needed to be added while 3-mercaptopropionic acid (MPA) is added into the CuInSe quantum dot solution with the long-chain ligand, and a volume ratio of the CuInSe quantum dot solution to MPA to the deionized water may be 2:1:2. When the MPA material is adopted, an added solvent is the deionized water. Certainly, when other short-chain ligand materials are adopted, the added solvent is selected according to the type of the short-chain ligand so that the short-chain ligand material can be dissolved in the solvent.

S402, a sodium hydroxide solution is added into the mixed solution to adjust a PH value of the mixed solution.

Optionally, the short-chain ligand material is combined with the surface of the quantum dot under an alkaline environment more easily. Taking the 3-mercaptopropionic acid (MPA) short-chain ligand material as an example, mercapto is combined with the surface of the quantum dot under the alkaline environment more easily, thus the sodium hydroxide solution may be added into the mixed solution in S401 to adjust the PH value of the mixed solution to be in alkalinity, and the PH value of the mixed solution may be determined through a pH meter or pH test paper in the duration.

S403, the mixed solution is stirred for a first preset duration so as to enable the short-chain ligand to substitute the long-chain ligand.

Optionally, in order to enable the short-chain ligand to be sufficiently exchanged with the long-chain ligand on the surface of the CuInSe quantum dot, the mixed solution with the adjusted PH value in S402 can be stirred by a certain time.

During specific implementation, in the above manufacturing method of the hole transport material provided by an embodiment of the present disclosure, when the PH value of the mixed solution with the adjusted PH value in above S402 is 8-9, the effect that the short-chain ligand substitutes the long-chain ligand is good.

During specific implementation, in the above manufacturing method of the hole transport material provided by an embodiment of the present disclosure, after stirring the mixed solution for the first preset duration in S403 so as to enable the short-chain ligand to substitute the long-chain ligand, the manufacturing method further includes:

the mixed solution is subjected to standing for a second preset duration.

Optionally, the quantum dot substituted by the short-chain ligand needs to be transferred into a certain solvent for subsequent purifying and cleaning, therefore, the quantum dot mixed solution substituted by the short-chain ligand needs to be subjected to standing for a certain time in order to make the exchanged quantum dot to be transferred into the solvent.

During specific implementation, in the above manufacturing method of the hole transport material provided by an embodiment of the present disclosure, the first preset duration may be 1-3 hours, the second preset duration is at least greater than 2 hours, and the specific time may be determined according to actual needs.

Figure 6:
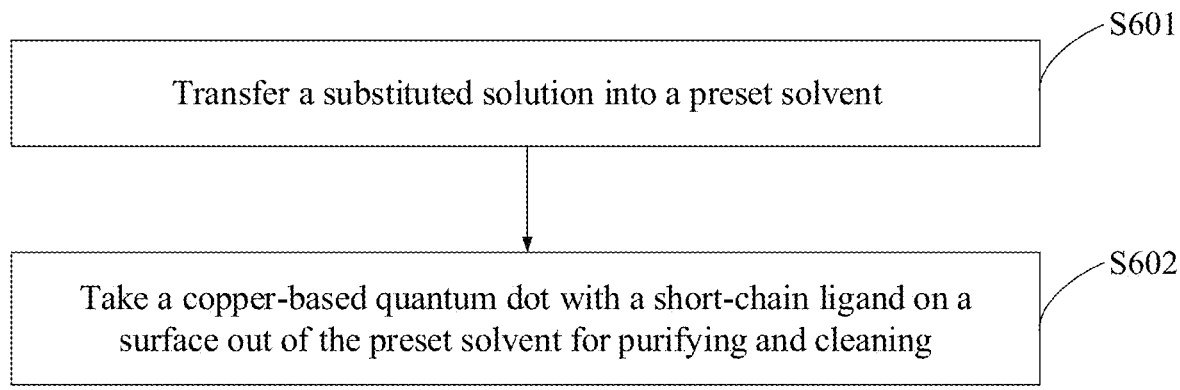
FIG. 6 is a flow diagram of yet another manufacturing method of a hole transport material provided by an embodiment of the present disclosure.

During specific implementation, in the above manufacturing method of the hole transport material provided by an embodiment of the present disclosure, in S203, cleaning the substituted solution to obtain the copper-based quantum dot with the short-chain ligand on the surface, as shown in FIG. 6, may specifically include:

S601, the substituted solution is transferred into a preset solvent.

Optionally, taking the CuInSe quantum dot substituted by the MPA short-chain ligand material as an example, the MPA short-chain ligand material can be dissolved in a aqueous phase, therefore, the substituted quantum dot needs to be transferred into the aqueous phase (preset solvent), and there is an obvious stratification phenomenon. The long-chain ligand is in an organic phase, and the CuInSe quantum dot of the short-chain ligand is in the aqueous phase. It should be noted that because the MPA short-chain ligand material can be dissolved in the aqueous phase, the preset solvent is water. Certainly, when other short-chain ligand materials are adopted, the preset solvent is selected according to the solvent capable of dissolving the short-chain ligand material.

S602, the copper-based quantum dot with the short-chain ligand on the surface is taken out of the preset solvent for purifying and cleaning.

Optionally, the short-chain ligand CuInSe quantum dot in the aqueous phase in S401 is taken out, a methanol solution may be adopted for purifying and cleaning, and purifying and cleaning may be performed for many times. The finally obtained short-chain ligand CuInSe quantum dots may be dispersed in the deionized water to form a solution with a certain concentration, to serve as the hole transport layer material, thereby improving the electrical conductivity of the quantum dot, improving the carrier transport efficiency and improving the performance of the quantum dot light emitting device.

Based on the same inventive concept, an embodiment of the present disclosure further provides a manufacturing method of a quantum dot light emitting device, including:

forming an anode, a hole transport layer, a quantum dot light emitting layer and a cathode disposed in a stacked mode, wherein a material of the hole transport layer is a copper-based quantum dot with a short-chain ligand on a surface.

According to the above manufacturing method of the quantum dot light emitting device provided by an embodiment of the present disclosure, the copper-based quantum dot with the short-chain ligand on the surface is adopted to be used for the hole transport material, thereby improving the electrical conductivity of the quantum dot, improving the carrier transport efficiency and improving the performance of the quantum dot light emitting device. In addition, the copper-based quantum dot, serving as the inorganic hole transport material, has the high hole mobility and good stability, and may be subjected to solvation treatment. Moreover, the copper-based quantum dot is selected as the hole transport material, and the energy level can be conveniently adjusted by adjusting the particle size so as to be better matched with the light emitting layer.

During specific implementation, in the above manufacturing method of the quantum dot light emitting device provided by an embodiment of the present disclosure, a chain length of the short-chain ligand is generally less than ten carbon atoms, and a chain length of a long-chain ligand is generally greater than ten carbon atoms.

During specific implementation, in the above manufacturing method of the quantum dot light emitting device provided by an embodiment of the present disclosure, a ligand containing groups such as mercapto, amino and carboxyl is coordinated with the quantum dot more easily, therefore, the short-chain ligand provided by some embodiments of the present disclosure may be a ligand including mercapto, amino or carboxyl.

During specific implementation, in the above manufacturing method of the quantum dot light emitting device provided by an embodiment of the present disclosure, the short-chain ligand may include 3-mercaptopropionic acid, caprylic acid, octylamine or hexanethiol and other ligands. These short-chain ligands may be exchanged with a copper-based quantum dot with a long-chain ligand on a surface to form the copper-based quantum dot of the short-chain ligand, to serve as the hole transport layer material, thereby improving the electrical conductivity of the quantum dot, improving the carrier transport efficiency and improving the performance of the quantum dot light emitting device.

During specific implementation, in the above manufacturing method of the quantum dot light emitting device provided by an embodiment of the present disclosure, when the short-chain ligand adopts 3-mercaptopropionic acid (MPA), a group coordinated with the quantum dot is mercapto; when the short-chain ligand adopts caprylic acid, a group coordinated with the quantum dot is carboxyl; when the short-chain ligand adopts octylamine, a group coordinated with the quantum dot is amino; and when the short-chain ligand adopts hexanethiol, a group coordinated with the quantum dot is mercapto.

It should be noted that some embodiments of the present disclosure only provide part of the short-chain ligand. Certainly, during specific implementation, the short-chain ligand is not limited to these ligands provided by some embodiments of the present disclosure. The short-chain ligands having a strong complexing capability all fall within the protection scope of the present disclosure.

During specific implementation, in the above manufacturing method of the quantum dot light emitting device provided by an embodiment of the present disclosure, forming the hole transport layer, includes:

the hole transport layer is formed in a spin-coating or printing mode.

Optionally, because the material of the hole transport layer is the copper-based quantum dot with the short-chain ligand on the surface, the hole transport layer may be formed in the spin-coating or printing mode.

A preparation method is illustrated below by taking the upright quantum dot light emitting device as an example.

(1) a base substrate is cleaned and dried, and a material of the base substrate may be ITO glass or other substrate materials.

(2) a hole injection layer is prepared on the base substrate, for example, a PEDOT:PSS material is spin-coated on the ITO glass, and baking is performed at about 135° C. for about 20 min.

(3) the prepared short-chain ligand CuInSe quantum dot solution is spin-coated on the base substrate with the spin-coated hole injection layer, and baking is performed at about 130° C. for about 5 min to form the hole transport layer.

(4) a quantum dot light emitting material is spin-coated on the base substrate with the formed hole transport layer, and baking is performed at about 100° C. for about 5 min to form the quantum dot light emitting layer.

(5) a ZnO material is spin-coated on the base substrate with the formed quantum dot light emitting layer, and baking is performed at about 100° C. for about 5 min to form an electron transport layer.

(6) a layer of aluminum material with a thickness of 100 nm is evaporated on the base substrate with the formed electron transport layer to form a cathode.

(7) the prepared quantum dot light emitting device is packaged with a glass cover plate.

It should be noted that the present disclosure is illustrated by taking the upright quantum dot light emitting device as an example. When the quantum dot light emitting device of the present disclosure is inverted, the difference with the upright structure lies in that a sequence for manufacturing a film layer on the base substrate is opposite. The manufacturing sequence of the upright structure is to sequentially manufacture the anode, the hole injection layer, the hole transport layer, the quantum dot light emitting layer, the electron transport layer and the cathode on the base substrate, and the manufacturing sequence of the inverted structure is to sequentially manufacture the cathode, the electron transport layer, the quantum dot light emitting layer, the hole transport layer, the hole injection layer, and the anode on the base substrate. Regardless of the upright structure or the inverted structure, the material of the hole transport layer is the copper-based quantum dot with the short-chain ligand on the surface.

Based on the same inventive concept, an embodiment of the present disclosure further provides a display apparatus, including the above quantum dot light emitting device provided by the embodiment of the present disclosure. Because the principle for solving the problem of the display apparatus is similar to that of the aforementioned quantum dot light emitting device, implementation of the display apparatus may refer to that of the aforementioned quantum dot light emitting device, which will be not repeated.

During specific implementation, the above display apparatus provided by an embodiment of the present disclosure may be a full-screen display apparatus, or a flexible display apparatus and the like, which is not limited here.

Figure 7:
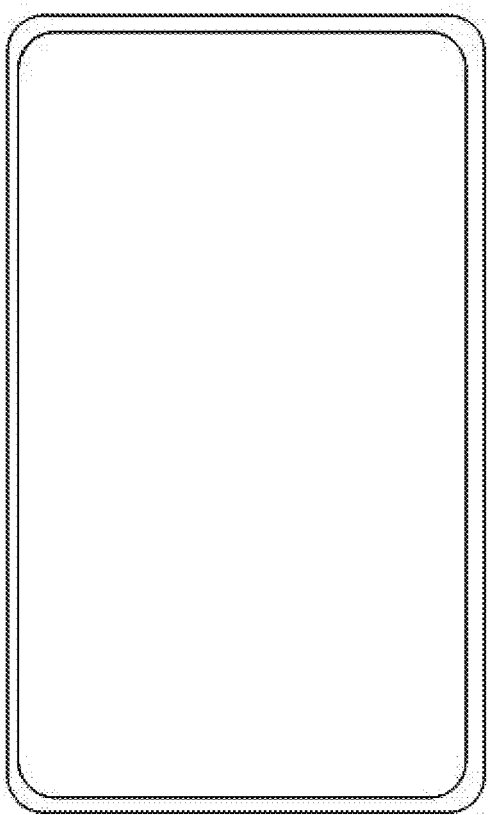
FIG. 7 is a schematic structural diagram of a display apparatus provided by an embodiment of the present disclosure.

During specific implementation, the above display apparatus provided by an embodiment of the present disclosure may be a full-screen mobile phone as shown in FIG. 7. Certainly, the above display apparatus provided by an embodiment of the present disclosure may also be any product or component with a display function, such as a tablet computer, a television, a displayer, a notebook computer, a digital photo frame and a navigator. It should be understood by a person of ordinary skill in the art that the display apparatus should have other essential constituent parts, which is not repeated here and may also not be regarded as limitation to the present disclosure.

Some embodiments of the present disclosure provide the quantum dot light emitting device and the application thereof. The manufacturing method of the hole transport material includes: the copper-based quantum dot with the long-chain ligand on the surface is prepared through the solution process; the short-chain ligand material is added into the copper-based quantum dot solution with the long-chain ligand on the surface so as to enable the short-chain ligand to substitute the long-chain ligand; and the substituted solution is cleaned to obtain the copper-based quantum dot with the short-chain ligand on the surface to serve as the hole transport material. The copper-based quantum dot is the common chalcopyrite semiconductor material, has the advantages of bandgap adjustability, hypotoxicity, simple preparation, low cost and the like, and can serve as the hole transport material to be used in the quantum dot light emitting diode device, and the energy level can be adjusted by adjusting the particle size of the copper-based quantum dot so as to be better matched with the quantum dot light emitting layer. The preparation method of the quantum dot mostly adopts the solution process. Because the long-chain organic solvent usually serves as the quantum dot ligand and has the effects of stabilizing the quantum dot structure and improving the quantum dot synthesizing efficiency, the long-chain ligand is usually used during quantum dot synthesis. However, when the quantum dot serves as the functional layer material (for example, the hole transport layer) to be applied, although these organic long-chain ligands enable the quantum dots to be stably dispersed in the nonpolar solvent, most organic macromolecules have the insulating property, which severely affects the charge transport between the quantum dots, also makes the charge transport property of the formed quantum dot film poor, and severely affects the device performance if the quantum dot serves as the hole transport material to be used in the quantum dot light emitting device. Therefore, the copper-based quantum dot with the short-chain ligand on the surface is adopted to serve as the hole transport material in the present disclosure, thereby improving electrical conductivity of the quantum dot, improving the carrier transport efficiency, and improving performance of the quantum dot light emitting device.

Although the preferred embodiments of the present disclosure have been described, those skilled in the art can make additional modifications and variations on the embodiments once they know the basic creative concept. Therefore, the appended claim intends to be explained as including the preferred embodiments and all modifications and variations falling within the scope of the present disclosure.

Obviously, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent art, the present disclosure also intends to include these modifications and variations.

What is claimed is:

1. A quantum dot light emitting device, comprising: an anode and a cathode disposed oppositely, a quantum dot light emitting layer arranged between the anode and the cathode, and a hole transport layer arranged between the anode and the quantum dot light a emitting layer, wherein material of the hole transport layer is a copper-based quantum dot with a short-chain ligand on a surface.

2. The quantum dot light emitting device according to claim 1, wherein a chemical formula of the copper-based quantum dot is CuXY, where X=Ga or In, and Y=S, Se or Te.

3. The quantum dot light emitting device according to claim 1, wherein a chain length of the short-chain ligand is less than ten carbon atoms.

4. The quantum dot light emitting device according to claim 1, wherein the short-chain ligand is a ligand comprising mercapto, amino or carboxyl.

5. The quantum dot light emitting device according to claim 4, wherein the short-chain ligand comprises 3-mercaptopropionic acid, caprylic acid, octylamine or hexanethiol.

6. A display apparatus, comprising the quantum dot light emitting device according to claim 1.

7. A method for manufacturing a hole transport material, comprising:
preparing a copper-based quantum dot with a long-chain ligand on a surface through a solution process;
adding a short-chain ligand material into a solution of the copper-based quantum dot solution so as to enable a short-chain ligand to substitute the long-chain ligand; and
cleaning a substituted solution to obtain a copper-based quantum dot with the short-chain ligand on a surface to serve as the hole transport material.

8. The method according to claim 7, wherein a chemical formula of the copper-based quantum dot is CuXY, where X=Ga or In, and Y=S, Se or Te.

9. The method according to claim 7, wherein adding the short-chain ligand material into a solution of the copper-based quantum dot so as to enable the short-chain ligand to substitute the long-chain ligand, comprises:
adding the short-chain ligand material into the solution of the copper-based quantum dot solution to form a mixed solution;
adding a sodium hydroxide solution into the mixed solution to adjust a PH value of the mixed solution; and
stirring the mixed solution for a first preset duration so as to enable the short-chain ligand to substitute the long-chain ligand.

10. The method according to claim 9, wherein the PH value of the mixed solution is 8-9.

11. The method according to claim 9, after stirring the mixed solution for the first preset duration so as to enable the short-chain ligand to substitute the long-chain ligand, further comprising:
standing the mixed solution for a second preset duration.

12. The method according to claim 11, wherein the first preset duration is 1-3 hours, and the second preset duration is greater than 2 hours.

13. The method according to claim 7, wherein cleaning the substituted solution to obtain the copper-based quantum dot with the short-chain ligand on the surface, comprises:
transferring the substituted solution into a preset solvent; and
taking the copper-based quantum dot with the short-chain ligand on the surface out of the preset solvent for purifying and cleaning.

14. The method according to claim 7, wherein a chain length of the short-chain ligand is less than ten carbon atoms.

15. The method according to claim 7, wherein the short-chain ligand is a ligand comprising mercapto, amino or carboxyl.

16. The method according to claim 15, wherein the short-chain ligand comprises 3-mercaptopropionic acid, caprylic acid, octylamine or hexanethiol.

17. A method for manufacturing a quantum dot light emitting device, comprising:
forming an anode, a hole transport layer, a quantum dot light emitting layer and a cathode disposed in a stacked mode, wherein a material of the hole transport layer is a copper-based quantum dot with a short-chain ligand on a surface.

18. The method according to claim 17, wherein a chain length of the short-chain ligand is less than ten carbon atoms.

19. The method according to claim 17, wherein the short-chain ligand is a ligand comprising mercapto, amino or carboxyl.

20. The method according to claim 19, wherein the short-chain ligand comprises 3-mercaptopropionic acid, caprylic acid, octylamine or hexanethiol.

* * * * *